United States Patent [19]

Buffet

[11] 4,420,940
[45] Dec. 20, 1983

[54] THERMO-ELECTRIC INSTALLATIONS

[75] Inventor: Jean Buffet, Paris, France

[73] Assignee: Air Industrie, Courbevoie, France

[21] Appl. No.: 332,596

[22] Filed: Dec. 21, 1981

[30] Foreign Application Priority Data

Dec. 23, 1980 [FR] France .................................. 80 27374
Dec. 3, 1981 [FR] France .................................. 81 22636

[51] Int. Cl.³ .................................................. F25B 21/02
[52] U.S. Cl. ................................................................ 62/3
[58] Field of Search ................................................ 62/3

[56] References Cited

U.S. PATENT DOCUMENTS 3,196,620  7/1965  Elfving et al. .......................... 62/3
4,297,849  11/1981 Buffet ...................................... 62/3
4,306,426  12/1981 Berthet et al. ........................... 62/3

Primary Examiner—Lloyd L. King
Attorney, Agent, or Firm—Larson and Taylor

[57] ABSTRACT

A thermo-electric installation comprising a first network of hot tubes extending between two ends disposed in parallel relation and in which flows a hot fluid, a second network of cold tubes, extending between two ends, disposed in parallel relation and in a plane parallel to the plane of the hot tubes, and in which flows a cold fluid, thermo-elements mounted between said hot tubes and said cold tubes, at least two mechanical connection structures, called hot structures, connecting the hot tubes together, respectively towards their two ends, these two hot structures being independent of the cold tubes, at least two mechanical connection structures, called cold structures, connecting together the cold tubes, respectively towards their two ends, these two cold structures being independent of the hot tubes, and fixing devices, for firmly connecting together the hot structures and the cold structures, situated at the same end.

10 Claims, 4 Drawing Figures

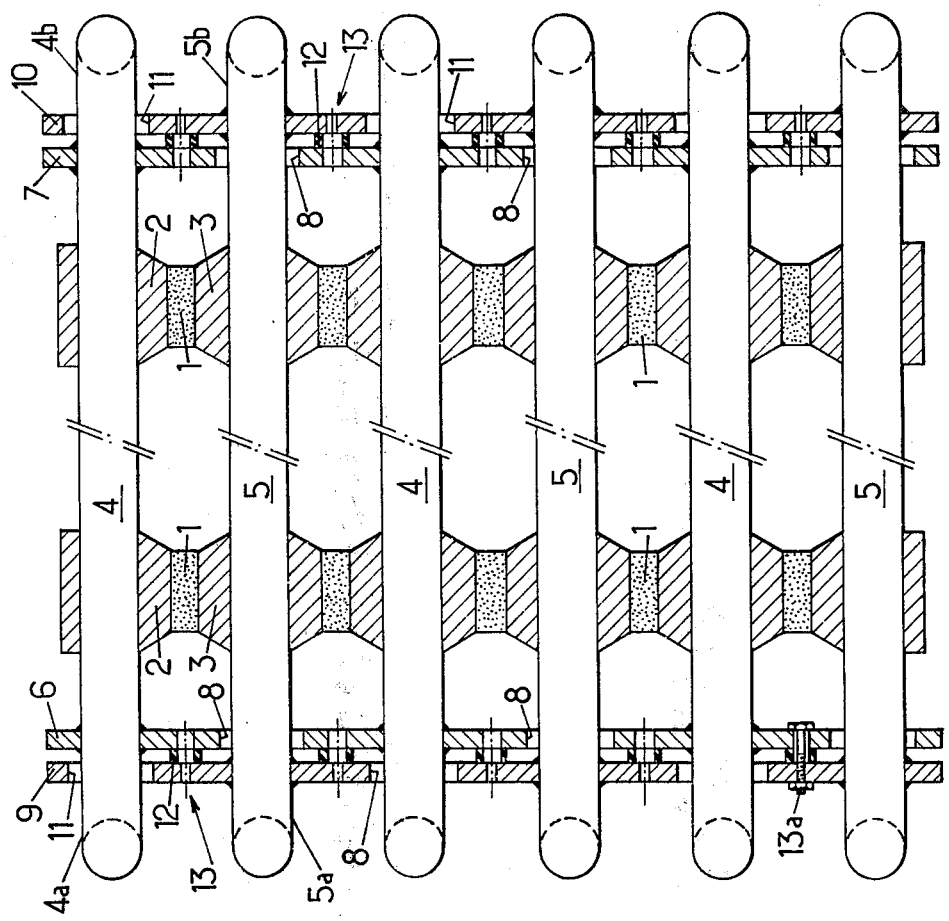

THERMO-ELECTRIC INSTALLATIONS

The invention relates generally to thermo-electric installations comprising thermo-elements mounted between two heat-exchange walls, namely a hot wall and a cold wall.

Such installations may be used for generating a DC electric current when the hot and cold walls are maintained at different temperatures or, on the contrary, to extract heat from a wall called "cold wall" and to draw it off through a wall called "hot wall", when a DC electric current flows in the thermo-elements.

The invention applies more particularly, but not exclusively, to installations of this latter type, the thermo-elements being supplied with DC electric current in order to extract heat from a cold wall and to draw it off through a hot wall. Such an installation, called "heat pump", may be used for producing "heat" or "cold". In fact, the thermo-elements are of two types, namely the thermo-elements of type P which transfer heat in the direction of the current and thermo-elements of type N which transfer heat in the reverse direction of the current.

In the construction of such installations, it has already been proposed to cause each wall, hot or cold, to cooperate with a hot or cold tube in which flows a hot fluid.

Thus thermo-electric installations are known comprising:

a first network of parallel hot tubes in which flows a hot fluid, a second network of parallel cold tubes, disposed parallel to the hot tubes of the first network, and in which flows a cold fluid.

The thermo-elements are then mounted, generally with interposition of a hot wall and a cold wall, between said hot tubes and said cold tubes.

In an installation of this type, mechanical connection means are provided for holding therebetween the first and second network of hot and cold tubes and for creating an application force between said hot and cold tubes and said thermo-elements.

Up to present, known mechanical connection means depend on solutions which were more or less complex to implement, which caused pressure losses in the fluid, which gave rise to sealing problems, which introduced contact heat resistance at the level of the thermo-elements and which did not present sufficient reliability in operation.

Among these solutions the following may be mentioned:

Rods were provided, disposed transversely to the hot and cold tubes, ensuring an application force between said hot and cold tubes and said thermo-elements (the disadvantage of complicating the installation through a multiplicity of mechanical structures inside the two hot and cold tube networks).

Tubes were provided formed by a succession of rigid sections and deformable bellows capable of accommodating the deformations due to the temperature variations (the disadvantage of requiring sealed connections between each rigid section and each deformable bellows, of presenting leakage risks, and of generating pressure losses in the fluid).

The thermo-elements were provided held in place in a rigid frame thermically insulated with respect to the tubes and sliding contacts were placed between the thermo-elements and the tubes allowing relative movement between each thermo-element and each tube (the disadvantage of causing heat resistance which, moreover, risks increasing during the period of use of the installation and the disadvantage of being a complex and expensive construction).

The invention has precisely as its aim to provide mechanical connection means which do not present the drawbacks mentioned above in connection with the known solutions.

In accordance with the invention, the mechanical connection means allow:

a simple installation to be constructed in which the inner space occupied by the two hot and cold tube networks is free from any internal mechanical structure, continuity of the hot and cold tubes to be maintained without using sections having different mechanical characteristics, so avoiding any sealing connection, removing leakage risks and reducing to a maximum the pressure losses in the fluid, low heat resistances constant in time to be obtained, the cost price to be reduced while providing simple and inexpensive mounting and construction (construction by layers of tubes at the same temperature and mounting by stacking identical tubes).

According to the invention the installation comprises:

a first network of hot tubes extending between two ends, disposed in parallel relation, and in which flows a hot fluid, a second network of cold tubes, extending between two ends, disposed in parallel relation and in a plane parallel to the plane of the hot tubes, and in which flows a cold fluid, thermo-elements mounted between said hot tubes and said cold tubes, and mechanical connection means for holding therebetween the first and second networks of hot and cold tubes and/or for creating an application force between said hot and cold tubes and said thermo-elements, and it is characterized by the fact that these mechanical connection means are essentially formed by:

at least two mechanical connection structures, called hot structures, connecting the hot tubes together, respectively towards the two ends thereof, these hot structures being independent of the cold tubes, at least two mechanical connection structures, called cold structures, connecting the cold tubes together, respectively at the two ends thereof, these two cold structures being independent of the hot tubes, and fixing means for firmly securing together the hot structures and the cold structures at the same end.

The fixing means are advantageously arranged so as to provide solid transverse (perpendicular to the hot and cold tubes) and/or axial (parallel to the hot and/or cold tubes) connection between the hot structures and the cold structures.

The invention will in any case be well-understood with the help of the complement of description which follows as well as the accompanying drawings, which complement and drawings are relative to preferred embodiments of the invention and do not of course comprise any limiting character.

FIG. 1, of these drawings, is a schematical sectional view of a thermo-electric installation constructed in accordance with a first embodiment of the invention.

FIG. 3 is a schematical sectional view of a thermoelectric installation constructed in accordance with a second embodiment of the invention.

Figure 2:
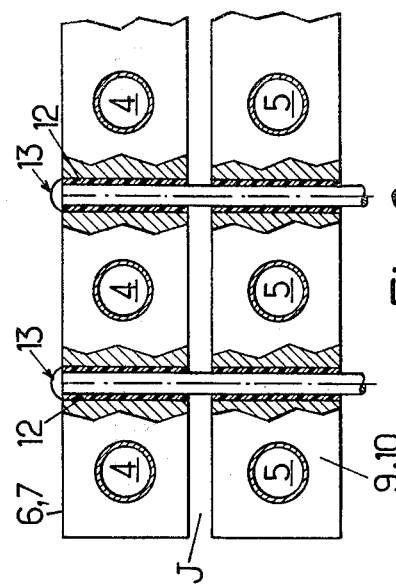
FIG. 2 is a partial sectional view through a plane perpendicular to that of FIG. 1.

The installation shown in FIGS. 1 to 4 comprises thermo-elements 1, mounted between two heat-exchange walls, namely a hot heat-exchange wall 2 and a cold heat-exchange wall 3.

The installation is of the "heat pump" type and the thermoelements 1 are supplied from a DC current source (not shown) so as to maintain the faces of the thermo-elements at different temperatures.

Each hot 2 and cold 3 heat-exchange wall cooperates respectively with a hot tube 4 and with a cold tube 5.

The installation comprises then:

a first network of hot tubes 4, extending between two ends 4a, 4b, disposed in parallel relation, and in which flows a hot fluid, a second network of cold tubes 5, extending between two ends 5a, 5b, disposed in parallel relation and in a plane parallel to the plane of the hot tubes 4 of the first network, and in which flows a cold fluid.

The thermo-elements 1 are mounted between said hot tubes and said cold tubes 5, with corresponding hot 2 and cold 3 heat-exchange walls placed therebetween.

Mechanical connection means are then provided for holding therebetween the first and second hot 4 and cold 5 tube networks and for creating an application force between said hot 4 and cold 5 tubes and said thermo-elements 1. These mechanical connection means are essentially formed by:

at least two mechanical connection structures, called hot structures 6, 7, connecting the hot tubes 4 together, respectively towards their two ends 4a, 4b, these two hot structures 6, 7 being independent of the cold tubes 5, at least two mechanical connection structures, called cold structures 9, 10, connecting the cold tubes 5 together, respectively towards their two ends 5a, 5b, these two cold structures 9, 10 being independent of the hot tubes 4, and fixing means 13 for connecting firmly together the hot structures 6, 7 and the cold structures 9, 10 situated at the same end 4a, 5a or 4b, 5b.

Figure 1:
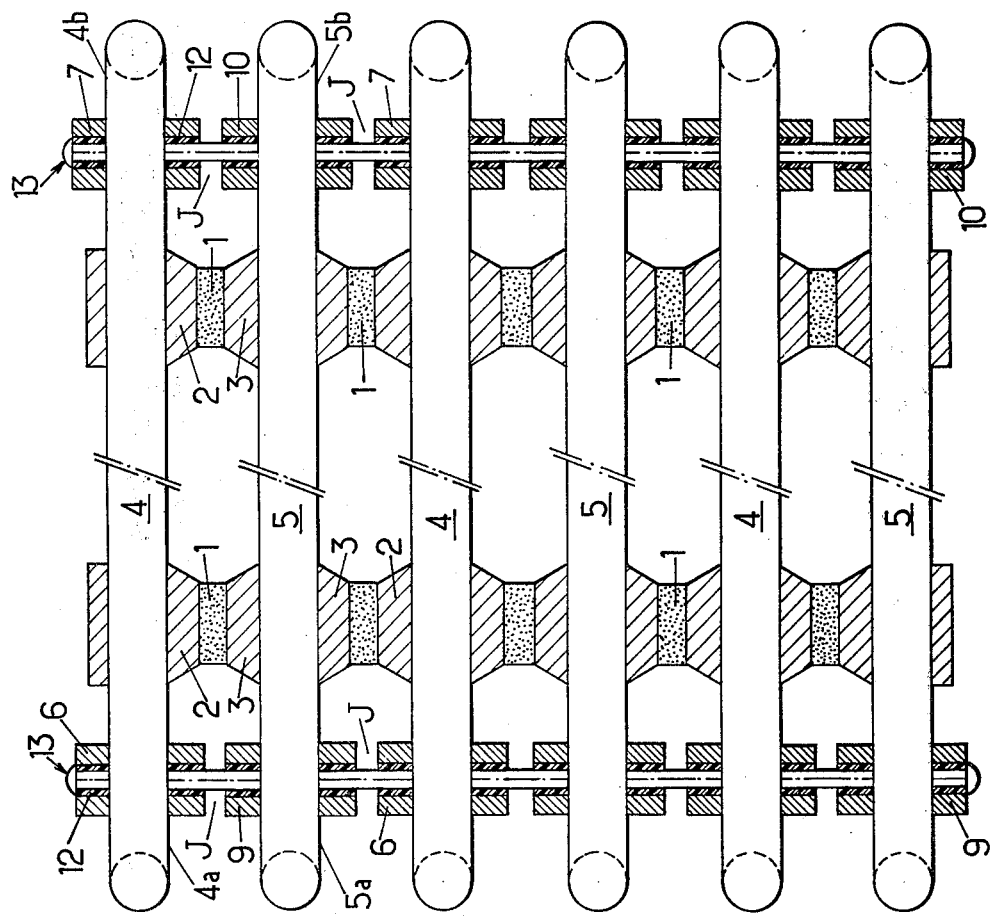

According to the embodiment of the invention illustrated in FIGS. 1 and 2, the fixing devices 13 are arranged so as to provide solid transverse connection—i.e. in a direction perpendicular to the hot tubes 4 and the cold tubes 5—of the hot structures 6, 7 and the cold structures 9, 10.

To this end, a construction may be used in which:

the hot structures 6, 7 are formed by hot flanges each connecting together the tubes of a layer of hot tubes 4, the cold structures 9, 10 are formed by cold flanges each connecting together the tubes of a layer of cold tubes 5, the size of these hot and cold flanges in the direction perpendicular to the plane of the tubes being such that there exists a clearance J between two adjacent hot and cold flanges.

The fixing devices 13 are then formed by a plurality of rods arranged to pass through the two successions of hot and cold flanges which are respectively at the two ends 4a, 5a and 4b, 5b of the hot tubes 4 and the cold tubes 5.

Heat-insulating devices 12 may be placed between the fixing devices 13 and the hot and cold flanges.

Advantageously, the hot flanges 6, 7 and the cold flanges 9, 10 may be in the form of steel sections.

In the embodiment of the invention illustrated in FIG. 3, the fixing devices 13 are arranged so as to provide solid axial connection—i.e. in a direction parallel to the hot tubes 4 and/or the cold tubes 5, of the hot structures 6, 7 and the cold structures 9, 10.

To this end, a construction may be used in which:

the two hot structures 6, 7 are formed by at least two hot plates, parallel to each other and connected to each of the hot tubes 4 respectively towards their two ends 4a, 4b, these two hot plates having apertures 8 which make them independent of the cold tubes 5, the two cold structures 9, 10 are formed by at least two cold plates, parallel to each other and connected to each of the cold tubes 5 respectively towards their two ends 5a, 5b, these two cold plates having apertures 11 which make them independent of hot tubes 4.

The fixing devices 13 are then arranged to hold the hot and cold plates connected axially to each other.

Advantageously, the two cold plates 9, 10 are situated further inwardly than the two hot plates 6, 7, in which case the fixing devices 13 play only a supporting role.

However, the two hot plates 6, 7 could be placed further outwardly with respect to the two cold plates 9, 10; in this case, the fixing devices 13 work under traction and provide a certain resilience for the whole of the installation.

These fixing devices 13 may be advantageously formed by bolts 13a passing through the hot plate 6, 7 and the cold plate 9, 10. The holes through which these bolts 13a pass may be elongated in the direction in which the thermo-elements 1 are held against the hot tubes 4 and the cold tubes 5, either in the hot plates, or in the cold plates, or in both.

Heat-insulating means 12 are placed between each hot plate 6, 7 and each cold plate 8, 10 corresponding thereto.

Figure 4:
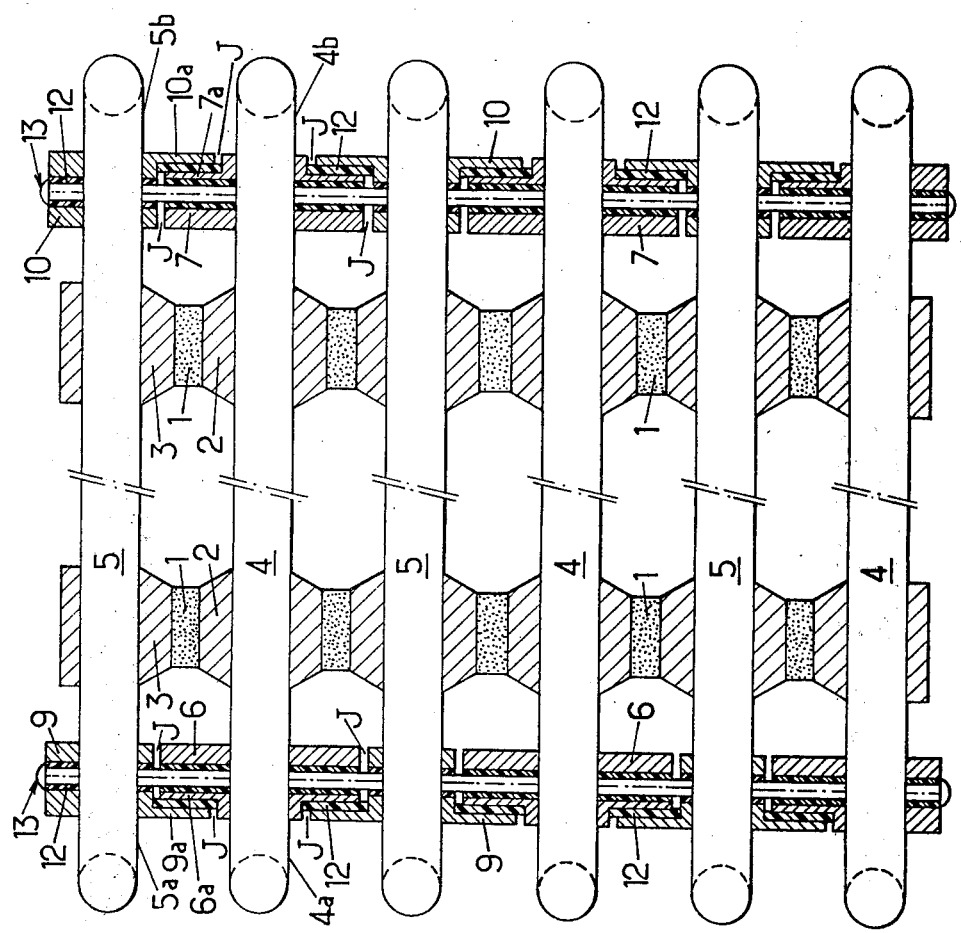
FIG. 4 is a schematical sectional view of a thermoelectric installation constructed in accordance with a third embodiment of the invention.

According to the embodiment illustrated in FIG. 4, the fixing devices 13 are arranged so as to provide a solid transverse (in the direction perpendicular to the hot tubes 4 and to the cold tubes 5) and axial (in the direction parallel to the hot tubes 4 and/or the cold tubes 5) connection between the hot structures 6, 7 and the cold structures 9, 10.

To this end, a construction may be used similar to the one shown in FIG. 1, the fixing devices 13, in the form of rods, being then arranged so as to resist shearing and to oppose relative axial movements between the hot flanges 6, 7 and the cold flanges 9, 10.

However the construction shown in FIG. 4 may also be used in which the hot flanges 6, 7 have bearing surfaces 6a, 7a cooperating with abutment surfaces 9a, 10a provided on the cold flanges 9, 10.

Heat-insulating means 12 may be placed between the fixing means 13, in the form of rods, and the hot flanges 6, 7 and/or the cold flanges 9, 10.

If a hot flange 6, 7 - cold flange 9, 10 cooperation through bearing surfaces 6a, 7a and abutment surfaces 9a, 10a is provided, there may be provided between said bearing 6, 7a and abutment 9a, 10a surfaces, other heat insulating means 12.

In the embodiment illustrated in FIGS. 1 and 2, the installation is particularly simple for the inner space occupied by the two hot and cold tube networks is free from any internal structure for compressing the thermo-elements. Furthermore, a particular arrangement of the fixing devices in the form of rods resisting shearing allows relative axial movements between the hot and cold flanges to be opposed, so relative axial movements between hot tubes and cold tubes to be avoided and any shearing stress at the level of the thermo-elements to be avoided.

In the embodiment of the invention illustrated in FIG. 3, the cooperation between hot plates and cold plates also allows relative axial movements between hot tubes and cold tubes to be opposed so any shearing stress at the level of the thermo-elements to be avoided.

In the embodiment of the invention illustrated in FIG. 4, the combined advantages of the construction of FIGS. 1 and 2 and FIG. 3 are obtained: absence of any internal structure for compressing the thermo-elements, and cooperation between hot and cold tubes avoiding any shearing stress at the level of the thermo-elements.

In any case and whatever the embodiment adopted, the installation further offers the following advantages: risks of leakage of the hot and cold fluids eliminated; pressure losses in the hot and cold fluids reduced; low heat resistance constant in time obtained; simple construction and mounting; inexpensive construction.

Furthermore, it is possible to construct installations of the parallel hot and cold tube type (corresponding to the embodiments illustrated in FIGS. 1 to 4) or installations of the crossed-tube type, i.e. with hot tubes orthogonal to the cold tubes, while still remaining in parallel planes (installation not shown).

I claim:

1. A thermo-electric installation comprising:
   a first network of hot tubes, extending between two ends, disposed in parallel relation and in which flows a hot fluid,
   a second network of cold tubes, extending between two ends, disposed in parallel relation and in a plane parallel to the plane of the hot tubes, and in which flows a cold fluid,
   thermo-elements mounted between said hot tubes and said cold tubes,
   at least two mechanical connection structures, called hot structures, connecting the hot tubes together, respectively towards their two ends, these two hot structures being formed by hot flanges, each connecting together the tubes of a layer of hot tubes, and
   at least two mechanical connection structures, called cold structures, connecting together the cold tubes, respectively towards their two ends, these two cold structures being formed by cold flanges, each connecting together the tubes of a layer of cold tubes, the size of these hot and cold flanges in a direction perpendicular to the plane of the tubes being such that there exists a clearance between two adjacent hot and cold flanges,
   and fixing devices comprising a plurality of rods adapted to pass through the two successions of hot and cold flanges which are located respectively at the two ends of the hot tubes and of the cold tubes, said fixing devices providing said transverse connection perpendicular to the hot tubes and to the cold tubes between the hot structures and the cold structures,
   whereby the first and second network of hot and cold tubes are maintained, or an application force between said hot and cold tubes and said thermo-elements is created or both.

2. The installation according to claim 1, wherein the fixing devices are arranged so as to provide solid axial connection parallel to the hot tubes and/or the cold tubes between the hot structures and the cold structures.

3. The installation according to claim 1, wherein the hot and cold flanges are provided in the form of steel sections.

4. The installation according to claim 3, wherein the fixing devices in the form of rods are adapted to be able to resist shearing and to oppose relative axial movements between the hot flanges and the cold flanges.

5. The installation according to claim 3, wherein the hot flanges have bearing surfaces cooperating with abutment surfaces provided on the cold flanges.

6. The installation according to claim 4, wherein heat-insulating means are located between the fixing devices and the hot flanges and/or the cold flanges.

7. The installation according to claim 6, wherein heat-insulating means are located between the bearing and abutment surfaces.

8. A thermo-electric installation comprising:
   a network of hot tubes, extending between two ends, disposed in parallel relation in which flows a hot fluid,
   a second network of cold tubes, extending between two ends, disposed in parallel relation and in a plane parallel to the plane of the hot tubes, and in which flows a cold fluid,
   thermo-elements mounted between said hot tubes and said cold tubes,
   at least two mechanical connection structures, called hot structures, connecting the hot tubes together, respectively towards their two ends, these two hot structures being formed by at least two hot plates, parallel to each other and connected to each of the hot tubes respectively towards their two ends, these two hot plates having apertures which make them independent of the cold tubes, and at least two mechanical connection structures, called cold structures, connecting together the cold tubes, respectively toward their two ends, these two cold structures being formed by at least two cold plates, parallel to each other and connected to each of the cold tubes respectively towards their two ends, these two cold plates having apertures which make them independent of the hot tubes,
   and fixing devices for firmly connecting together the hot structure and the cold structure situated at the same end, said fixing devices providing solid axial connection parallel to the hot tubes or to the colds tubes or to both between the hot structures and the cold structures,
   whereby the first and second network of hot and cold tubes are maintained, or an application force between said hot and cold tubes and said thermo-elements is created, or both.

9. The installation according to claim 8, wherein the fixing devices are provided between each hot structure and each cold structure so as to hold them axially connected to each other.

10. The installation according to claim 9, wherein the fixing devices are formed by bolts passing through the hot plate and the cold plate and wherein the holes through which these bolts pass are elongated in the direction in which the thermo-elements are held against the hot tubes and the cold tubes, either in the hot plates, or in the cold plates, or in both.

* * * * *